US007068553B2

(12) United States Patent
Lee (10) Patent No.: US 7,068,553 B2
(45) Date of Patent: *Jun. 27, 2006

(54) ROW REDUNDANCY CIRCUIT

(75) Inventor: Chang Hyuk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 203 days.

This patent is subject to a terminal disclaimer.

(21) Appl. No.: 10/734,147

(22) Filed: Dec. 15, 2003

(65) Prior Publication Data

US 2004/0208067 A1  Oct. 21, 2004

(30) Foreign Application Priority Data

Apr. 21, 2003  (KR) .................. 10-2003-0025051

(51) Int. Cl.
 *G11C 29/00* (2006.01)
(52) U.S. Cl. ............ 365/200; 365/185.09; 365/185.17; 365/230.03; 365/230.06; 365/225.7
(58) Field of Classification Search ................ 365/200, 365/225.7, 230.06, 230.03, 185.09, 185.17
See application file for complete search history.

(56) References Cited

U.S. PATENT DOCUMENTS 5,373,475 A * 12/1994 Nagase .................. 365/222

6,920,073 B1 * 7/2005 Lee .............................. 365/200

FOREIGN PATENT DOCUMENTS

| KR | 2001-65069 | 7/2001 |
| KR | 2003-22611 | 3/2003 |

* cited by examiner

*Primary Examiner*—Richard Elms
*Assistant Examiner*—Pho M. Luu
(74) *Attorney, Agent, or Firm*—Heller Ehrman LLP (57) ABSTRACT

A row redundancy circuit includes a fuse box group array, a redundant row predecoder and a redundant sub-row decoder. The fuse box group array includes a plurality of fuse box groups to detect row addresses. The redundant row predecoder performs a logic operation on an output signal from the fuse box groups to selectively activate a redundant main wordline corresponding to a plurality of redundant sub-wordlines. The redundant sub-row decoder performs a logic operation on output signals from the fuse box groups, which are classified into group signals corresponding to the number of fuse boxes in each fuse box group, to output a boosting signal for selectively activating the plurality of sub-wordlines corresponding to the each redundant main wordline. In the row redundancy circuit, the current consumption due to generation of unnecessary boosting signals can be minimized because the boosting signal is prevented from being disabled and then enabled in every precharge mode.

8 Claims, 6 Drawing Sheets

ROW REDUNDANCY CIRCUIT

BACKGROUND OF THE INVENTION

1. Field of the Invention

The present invention generally relates to a row redundancy circuit, and more specifically, to a row redundancy circuit wherein eight redundant sub-wordlines are assigned to a redundant main wordline to reduce the number of redundant main wordlines and to control generation of a boosting signal effectively.

2. Description of the Prior Art

In general, a semiconductor memory having only one defect in numerous microscopic cells is considered defective because it does not serve as a memory, which results in reduction of yield.

A redundancy circuit, which has been provided to improve the yield, replaces failed cells with normal cells previously prepared in a memory.

That is, the redundancy circuit repairs defective memory cells by replacing wordlines connected to defective cells with redundancy wordlines. Specifically, if a row address for selecting defective cells is designated, a conventional row redundancy circuit performs a row redundancy operation by enabling wordlines connected to repaired cells instead of the defective cells.

In the conventional row redundancy circuit, one redundant main wordline corresponds to four redundant sub-wordlines. One of the four redundant sub-wordlines is enabled in response to a signal obtained by predecoding lower 2 bits of the row address for the redundancy operation.

Figure 1:
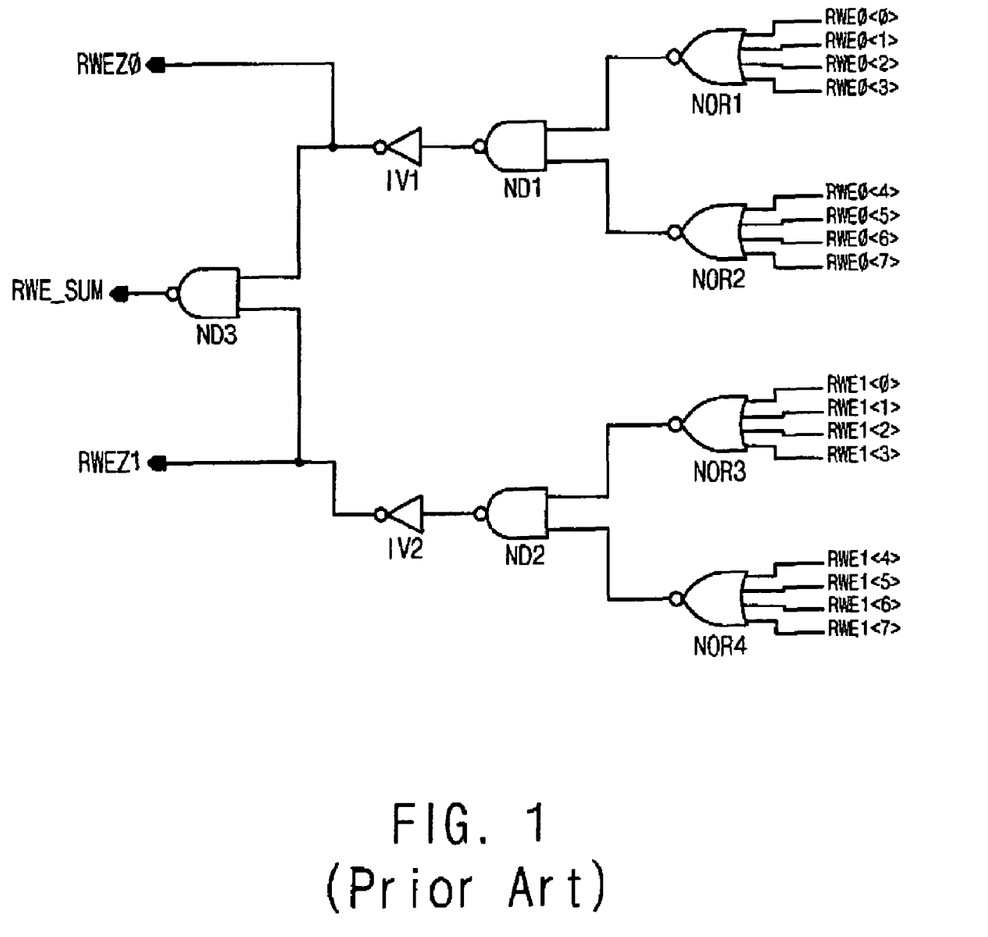
FIG. 1 is a circuit diagram of a conventional row redundancy circuit.

FIG. 1 is a circuit diagram of a conventional row redundancy circuit.

If an address of a defective cell is applied to the row redundancy circuit of FIG. 1, the row redundancy circuit performs a logic operation on output signals rwe0<0>~rwe0<7> and rwe1<0>~rwe1<7> of a fuse box array (not shown) for replacing an address path which selects the defective cell with another path which selects repaired cell. Then, the row redundancy circuit outputs a control signal rwe_sum for generating control signals rwez0 and rwez1 to enable a repair cell array block and a boosting signal to drive a sub-wordline of the enabled cell array block.

The row redundancy circuit comprises NOR gates NOR1~NOR4, NAND gates ND1~ND3, and inverters IV1 and IV2. The NOR gates NOR1~NOR4 perform a NOR operation on output signals rwe0<0>~rwe0<3>, rwe0<4>~rwe0<7>, rwe1<0>~rwe1<3> and rwe1<4>~rwe1<7> from four adjacent fuse boxes. The NAND gate ND1 performs a NAND operation on output signals from the NOR gates NOR1 and NOR2, and the NAND gate ND2 performs a NAND operation on output signals from the NOR gates NOR3 and NOR4. The inverters IV1 and IV2 invert output signals from the NAND gates ND1 and ND2 to output control signals rwez0 and rwez1, respectively. The NAND gate ND3 performs a NAND operation on output signals from the inverters IV1 and IV2 to output a control signal rwe_sum.

In the conventional row redundancy circuit, each fuse box (not shown) corresponds one by one to a redundant main wordline (not shown) which corresponds to four redundant sub-wordlines RSWL (not shown). The conventional row redundancy circuit controls generation of a boosting signal in response to a predecoding signal of lower bits of a repaired row address, thereby selecting one of the four redundant sub-wordlines.

In the conventional row redundancy circuit, the redundant main wordline is formed of a metal layer in a core region, and every four redundant sub-wordlines is assigned to a metal line. As a result, it is difficult to arrange a power line between metal lines due to insufficient space in the core region.

SUMMARY OF THE INVENTION

Accordingly, it is an object of the present invention to secure the space of the memory device by reducing the number of redundant main wordlines wherein one redundant main wordline corresponds to a plurality of redundant sub-wordlines (e.g. eight or more:multiples of 4).

It is another object of the present invention to minimize consumption of current by preventing undesired generation of boosting signals in a refresh mode.

In an embodiment, a row redundancy circuit comprises a fuse box group array, a redundant row predecoder and a redundant sub-row decoder. The fuse box group array comprises a plurality of fuse box groups including at least two or more fuse boxes to detect row addresses. The redundant row predecoder performs a logic operation on an output signal from the fuse box groups to selectively activate a redundant main wordline corresponding to a plurality of redundant sub-wordlines. The redundant sub-row decoder classifies output signals from the fuse box groups into group signals corresponding to the number of fuse boxes in each fuse box group and performs a logic operation on the group signals, to output a boosting signal for selectively activating the plurality of sub-wordlines corresponding to the each redundant main wordline. The boosting signal is disabled only when a new row address is applied.

DETAILED DESCRIPTION OF THE PREFERRED EMBODIMENTS

The present invention will be described in detail with reference to the accompanying drawings.

Figure 2:
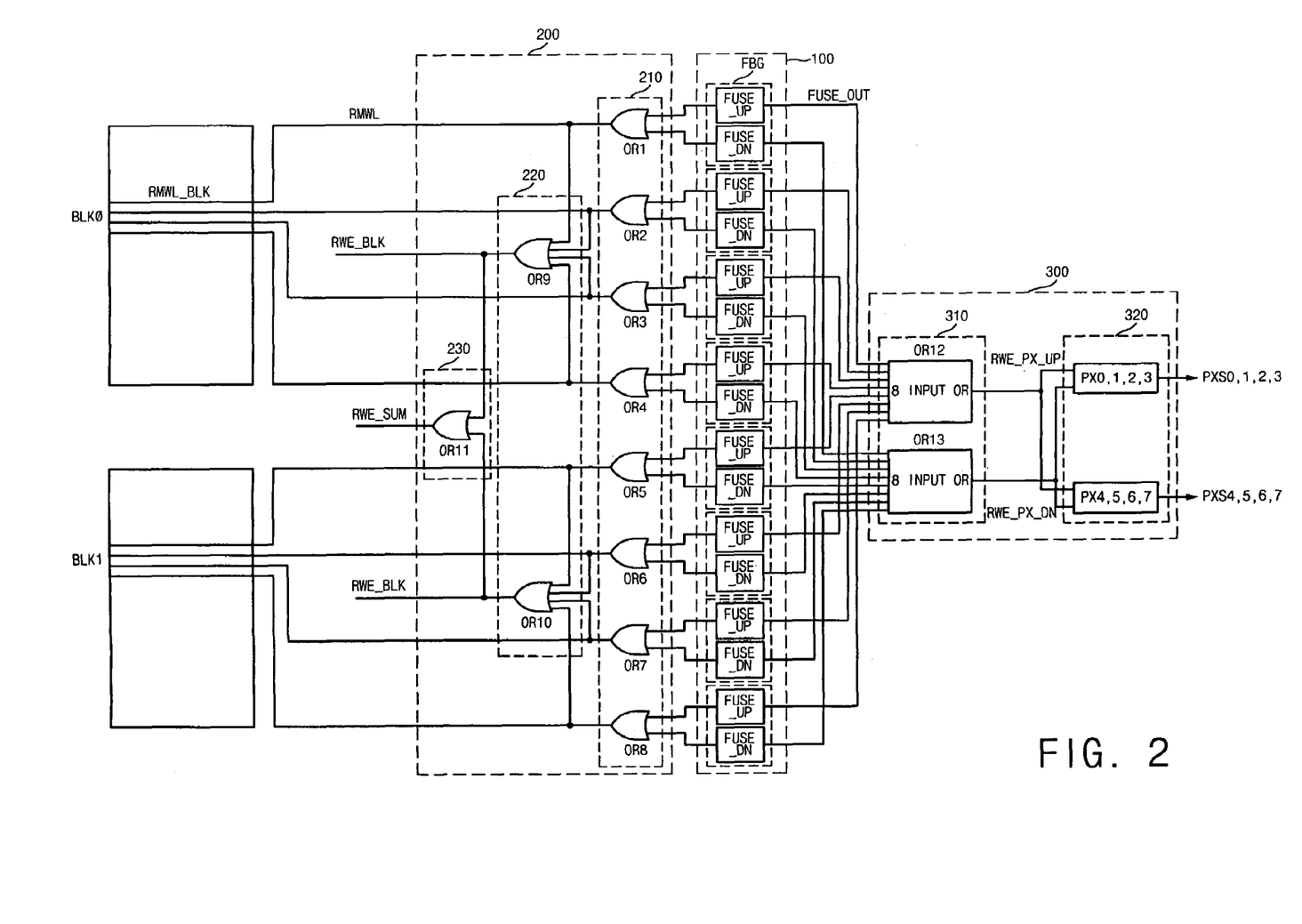
FIG. 2 is a circuit diagram of a row redundancy circuit according to an embodiment of the present invention.

FIG. 2 is a circuit diagram of a row redundancy circuit according to an embodiment of the present invention.

In an embodiment, a row redundancy circuit comprises a plurality of fuse box group and each fuse box group comprises a plurality of fuse boxes FUSE_UP and FUSE_DN. Each redundant main wordline RMWL corresponds to the fuse box group one by one. Each redundant main wordline RMWL corresponds to 8 redundant sub-wordlines (not shown). Since the 8 redundant sub-wordlines may be assigned to one redundant main wordline RMWL, the number of redundant main wordlines are reduced by half when compared to the conventional art wherein 4 redundant sub-wordlines are assigned to one redundant main wordline.

The 8 redundant sub-wordlines corresponding to each redundant main wordline RMWL are divided into 2 (the number of the fuse boxes consisting the fuse box group) groups depending on which one of the fuse boxes FUSE_UP and FUSE_DN consisting the fuse box group FBG is enabled. If an output signal of the fuse box FUSE_UP is enabled, one of the 4 upper redundant sub-wordlines is driven. If an output signal of the fuse box FUSE_DN is enabled, one of the 4 lower redundant sub-wordlines is driven.

In the row redundancy circuit, the consumption of unnecessary current can be prevented because an enabled boosting signal is not disabled in a precharge mode but disabled only when other row address is applied.

The above row redundancy circuit comprises a fuse box group array 100, a redundant row predecoder 200 and a redundant sub-row decoder (300).

The fuse box group array 100 comprises a plurality of fuse box groups FBG. Each fuse box group FBG comprises at least two or more fuse boxes (two fuse boxes FUSE_UP and FUSE_DN in an embodiment of the present invention). Each fuse box FUSE_UP and FUSE_DN is enabled when a programmed repair row address is applied. As a result, data are written or read through a repaired wordline.

The redundant row predecoder 200 performs a logic operation on output signals from the fuse box group array 100 to selectively activate the redundant main wordlines RMWL and its corresponding cell array blocks BLK0 and BLK1. When one of the fuse boxes FUSE_UP and FUSE_DN is enabled, the redundant row predecoder 200 activates a boosting control signal RWE_SUM, thereby generating a boosting signal indicative of a redundant mode. On the other hand, when both of the fuse boxes FUSE_UP and FUSE_DN is disabled, the redundant row predecoder 200 inactivates the control signal RWE_SUM, thereby generating a boosting signal indicative of a normal mode.

The redundant row predecoder 200 comprises a wordline selector 210, a cell block selector 220 and a boosting signal controller 230. The wordline selector 210 performs a logic operation on output signals from the fuse boxes FUSE_UP and FUSE_DN to selectively enable the redundant main wordlines RMWL. The cell block selector 220 performs a logic operation on output signals from the wordline selector 210 to output redundant block selecting signals RWE_BLK. The boosting signal controller 230 performs a logic operation on output signals from the cell block selector 220 to output a boosting control signal RWE_SUM.

The wordline selector 210 comprises OR gates OR1~OR8 for performing an OR operation on output signals from the fuse boxes FUSE_UP and FUSE_DN. The cell block selector 220 comprises OR gates OR9 and OR10 for performing an OR operation on output signals from OR gates OR1~OR4 and OR5~OR8. The boosting signal controller 230 comprises an OR gate OR11 for performing an OR operation on output signals from the OR gates OR9 and OR10.

When one of the fuse boxes FUSE_UP or FUSE_DN programmed by different row addresses is enabled, the corresponding redundant main wordline RMWL is activated. Accordingly, redundant sub-wordlines should be driven depending on which fuse box FUSE_UP or FUSE_DN is enabled.

The number of redundant sub-wordlines (8 in an embodiment of the present invention) corresponding to one redundant main wordline is divided into unit groups by the number of fuse boxes (2 in an embodiment of the present invention) in the fuse box group FBG. In an embodiment, the redundant sub-row decoder 300 selectively drives the divided redundant sub-wordlines depending on which fuse box FUSE_UP or FUSE_DN is enabled.

The redundant sub-row decoder 300 performs a logic operation on output signals from the fuse boxes FUSE_UP to generate redundant boosting control signal RWE_PX_UP, and performs a logic operation on output signals from the fuse boxes FUSE_DN to generate redundant boosting control signal RWE_PX_DN. The redundant sub-row decoder 300 classifies boosting signals PXS0~PXS7 into 2 groups, each group consisting of 4 boosting signals such as PXS0~PXS3 and PXS4~PXS7, by using the control signals RWE_PX_UP and RWE_PX_DN. In a repair mode wherein the control signal RWE_SUM is activated, the redundant sub-row decoder 300 selectively generates the boosting signals PXS0~PXS3 or PXS4~PXS7 in response to the redundant boosting control signals RWE_PX_UP and RWE_PX_DN and to predecoding signals LAX01 and LAX012 of the row address.

The redundant sub-row decoder 300 comprises a redundant boosting controller 310 and a boosting signal generator 320. The redundant boosting controller 310 performs a logic operation on output signals from the fuse boxes FUSE_UP or FUSE_DN in each fuse box group FBG to output the redundant boosting control signals RWE_PX_UP or RWE_PX_DN respectively. Depending on operation modes, the boosting signal generator 320 selectively outputs the boosting signals PXS0~PXS3 or PXS4~PXS7 in response to the redundant boosting control signals RWE_PX_UP and RWE_PX_DN and the predecoding signals LAX01 and LAX012.

The redundant boosting controller 310 comprises 8 input OR gates OR12 and OR13. The 8 input OR gate OR12 performs an OR operation on output signals from the fuse boxes FUSE_UP. The 8 input OR gate OR13 performs an OR operation on output signals from the fuse boxes FUSE_DN. The boosting signal generator 320 comprises a first boosting signal generator PX0,1,2,3 and a second boosting signal generator PX4,5,6,7. When the redundant boosting control signal RWE_PX_UP is enabled, the first boosting signal generator PX0,1,2,3 selectively outputs boosting signals PXS0,1,2,3 corresponding to the fuse boxes FUSE_UP. When the redundant boosting control signal RWE_PX_DN is enabled, the second boosting signal generator PX4,5,6,7 selectively outputs boosting signals PXS4, 5,6,7 corresponding to the fuse boxes FUSE_DN.

Figure 3:
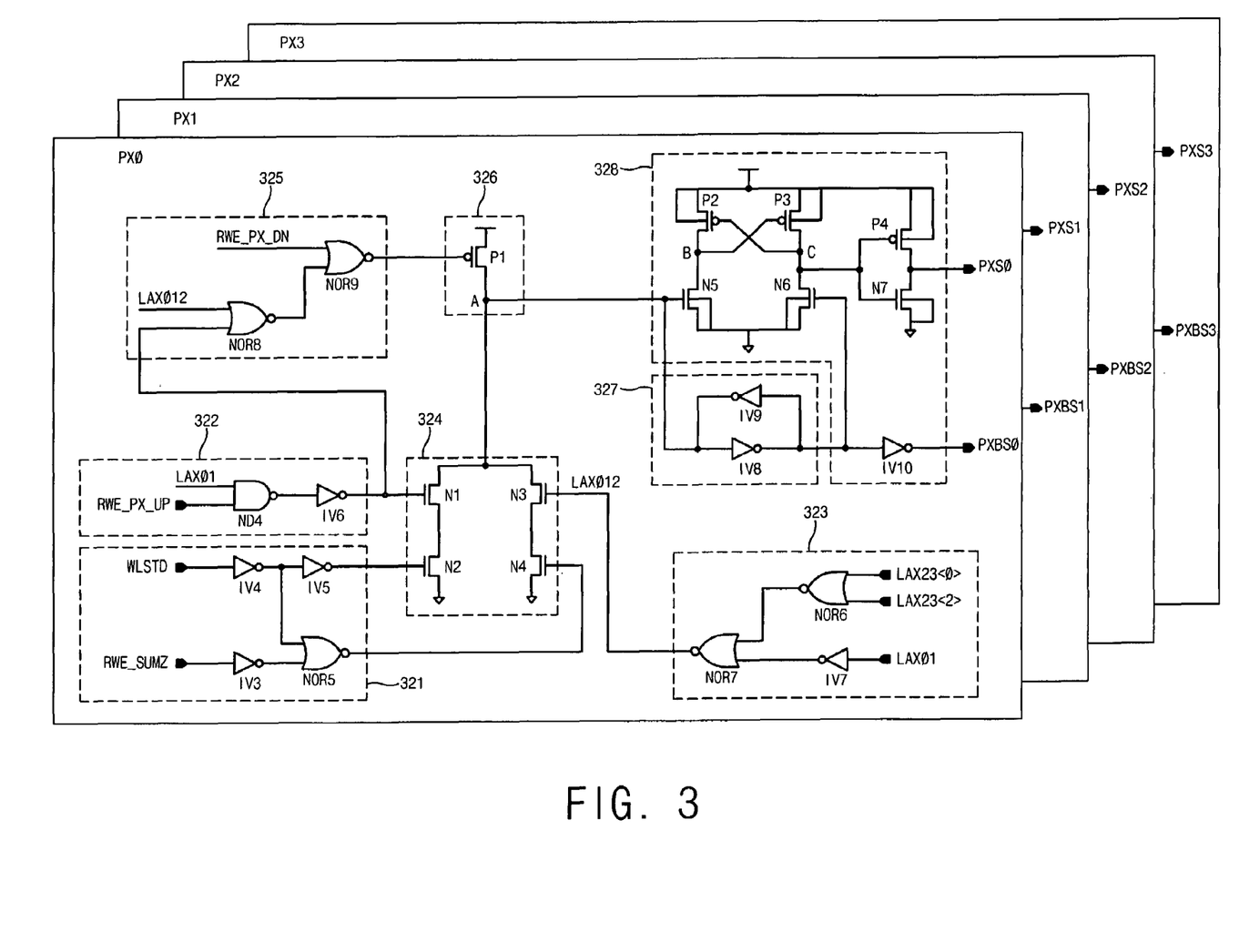
FIG. 3 is a circuit diagram of a fuse box according to an embodiment of the present invention.

FIG. 3 is a circuit diagram of the boosting signal generator PX0 according to an embodiment of the present invention.

In an embodiment, the first boosting signal generator PX0,1,2,3 has the same configuration and operation as those of the second boosting signal generator PX4,5,6,7. However, the boosting signal generators PX0,1,2,3 and PX4,5,6,7 are different in values of the redundant boosting control signal RWE_PX_UP and RWE_PX_DN and the predecoding signal LAX23. The difference is described with the explanation of the first boosting signal generator PX0,1,2,3.

Referring to FIG. 3, a control signal RWE_SUMZ is obtained by inverting the boosting control signal RWE_SUM of FIG. 2, and a control signal WLSTD becomes high in an active mode and becomes low in a precharge mode.

The first boosting signal generator PX0,1,2,3 comprises a mode controller 321, a repair controller 322, a normal controller 323, a mode selector 324, a pull-up controller 325, a pull-up unit 326, a latch unit 327 and a boosting signal output unit 328.

The mode controller 321 controls generation of boosting signals PXS0,1,2,3 and PXBS0,1,2,3 according to operation modes (repair mode or normal mode) depending on whether the redundant main wordline RMWL is activated or nor. In other words, depending on activation of the redundant main wordline RMWL, boosting signals PXS0,1,2,3 and PXBS0, 1,2,3 for driving redundant sub-wordlines (not shown) or for driving normal sub-wordlines (not shown) are generated selectively under the control of the mode controller 321.

The mode controller 321 comprises an inverter IV3 for inverting the control signal RWE_SUMZ, an inverter IV4 for inverting the control signal WLSTD, an inverter IV5 for inverting an output signal from the inverter IV4, and a NOR gate NOR5 for performing a NOR operation on output signals from the inverters IV3 and IV4.

In the repair mode, the repair controller 322 controls generation of the boosting signals PXS0,1,2,3 and PXBS0, 1,2,3 in response to the redundant boosting control signal RWE_PX_UP (RWE_PX_DN in case of the second boosting signal generator PX4,5,6,7) and to the predecoding signal LAX01 by the applied repair address.

The repair controller 322 comprises a NAND gate ND4 for performing a NAND operation on the redundant control signal RWE_PX_UP (RWE_PX_DN in case of the boosting signal generator PX4,5,6,7) and the predecoding signal LAX01, and an inverter IV6 for inverting an output signal from the NAND gate ND4.

In the normal mode, the normal controller 323 controls generation of boosting signals PXS0,1,2,3 and PXBS0,1,2,3 in response to the predecoding signal LAX012.

The normal controller 323 comprises a NOR gate NOR6 for performing a NOR operation on predecoding signals LAX23<0> and LAX23<2> (LAX23<1> and LAX23<3> in case of the boosting signal generator PX4,5,6,7), an inverter IV7 for inverting the predecoding signal LAX01, and a NOR gate NOR7 for performing a NOR operation on output signals from the NOR gate NOR6 and the inverter IV7. Here, using the predecoding signals LAX01 and LAX23 in order to obtain the predecoding signal LAX012 is to utilize the existing predecoding signal LAX23.

The mode selector 324 allows the boosting signals PXS0, 1,2,3 and PXBS0,1,2,3 of the corresponding operation modes to be enabled in response to an output signal of the mode controller 321. The mode selector 324 allows the boosting signals PXS0,1,2,3 and PXBS0,1,2,3 to be enabled in response to an output signal of the repair controller 322 in the repair mode while the mode selector 324 allows the boosting signals PXS0,1,2,3 and PXBS0,1,2,3 to be enabled in response to an output signal of the normal controller 323 in the normal mode.

The mode selector 324 comprises NMOS transistors N1, N2, N3 and N4. The NMOS transistors N1 and N2, connected in series between a node A and a ground voltage terminal, have each gate connected to each output terminal of the inverters IV6 and IV5. The NMOS transistors N3 and N4, connected in series between the node A and the ground voltage terminal, have each gate connected to each output terminal of the NOR gates NOR7 and NOR5.

The pull-up controller 325 controls the operation of the pull-up unit 326 by performing a logic operation on the redundant boosting control signal RWE_PX_DN (RWE_PX_UP in case of the boosting signal generator PX4,5,6,7) and output signals from the repair controller 322 and the normal controller 323.

The pull-up controller 325 comprises a NOR gate NOR8 for performing a NOR operation on output signals from the repair controller 322 and the normal controller 323, and a NOR gate NOR9 for performing a NOR operation on an output signal from the NOR gate NOR8 and the redundant boosting control signal RWE_PX_DN (RWE_PX_UP in case of the boosting signal generator PX4,5,6,7).

The pull-up unit 326 pulls up a voltage of the node A in response to an output signal of the pull-up controller 325. The pull-up unit 326 comprises a PMOS transistor P1. The PMOS transistor P1, connected between a power voltage terminal and the node A, has a gate connected to an output terminal of the pull-up controller 325.

The latch unit 327 latches an output signal from the pull-up unit 326. The latch unit 327 comprises inverters IV8 and IV9 whose input terminal and output terminal are interconnected.

The boosting signal output unit 328 outputs the boosting signals PXS0,1,2,3 and PXBS0,1,2,3 in response to output signals from the pull-up unit 326 and the latch unit 327.

The boosting signal output unit 328 comprises PMOS transistors P2, P3 and P4, NMOS transistors N5, N6 and N7, and an inverter IV10. The PMOS transistor P2 and the NMOS transistor N5, connected in series between the power voltage terminal and the ground voltage terminal, have each gate connected to a node C and the node A, respectively. The PMOS transistor P3 and the NMOS transistor N6, connected in series between the power voltage terminal and the ground voltage terminal, have each gate connected to a node B and an output terminal of the latch unit 327. The PMOS transistor P4 and the NMOS transistor N7, connected in series between the power voltage terminal and the ground voltage terminal with a push-pull type, have each gate connected to the node C in common to output the boosting signals PXS0,1,2,3. The inverter IV10 inverts an output signal from the latch unit 327 to output the boosting signals PXBS0,1, 2,3.

Figure 4:
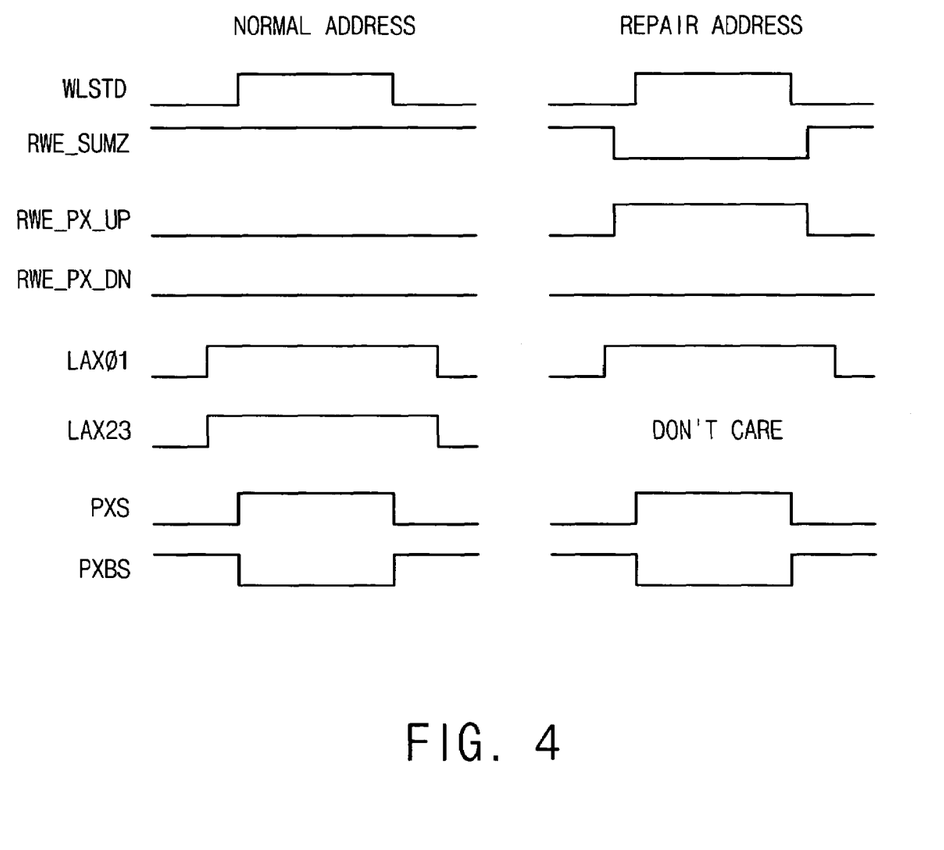
FIG. 4 is a timing diagram of the operation of the fuse box of FIG. 3.

FIG. 4 is a timing diagram of the operation of the fuse box of FIG. 3.

When a repair row address is applied (in a repair mode), a corresponding fuse box FUSE_UP of the fuse box group array 100 outputs a high level signal. As a result, the control signal RWE_SUMZ becomes at a low level, and the redundant boosting control signal RWE_PX_UP and RWE_PX_DN become at a high level and at a low level, respectively, which are inputted to the repair controller 322 and the pull-up controller 325.

If the selected bank is activated and the control signal WLSTD becomes at a high level, the NMOS transistor N2 is turned on and the NMOS transistor N4 is turned off. If the predecoding signal LAX01<0> is enabled, the NMOS transistor N1 is turned on and the PMOS transistor P1 is turned off regardless of the predecoding signal LAX012<0>. As a result, a node A is pulled down, and the boosting signal PXS0 is enabled.

When a high level signal is outputted from the fuse box FUSE_DN, the redundant boosting control signals RWE_PX_UP and RWE_PX_DN become at a low level and at a high level, respectively, which are applied to the pull-up controller 325 and the repair controller 322. As a result, the boosting signals PXS4,5,6,7 are selectively enabled in response to the predecoding signal LAX01.

When a normal address is applied (in a normal mode), output signals from the fuse boxes FUSE_UP and FUSE_DN become at the low level. The control signal RWE_SUMZ is maintained at the high level, and the redundant boosting control signals RWE_PX_UP and RWE_PX_DN are maintained at the low level.

If the corresponding bank is activated and the control signal WLSTD becomes at the high level, the NMOS transistor N2 is turned on. The NMOS transistor N4 is turned on because the output signal from the NOR gate NOR5 becomes at a high level. Since the redundant boosting control signal RWE_PX_UP (RWE_PX_DN in case of the boosting signal generator PX4,5,6,7) is not activated, the NMOS transistor N1 is maintained at a turn-off state although the predecoding signal LAX01<0> is enabled.

However, if one of the predecoding signals LAX23<0> and LAX23<2> is enabled, the predecoding signal LAX012<0> outputted from the normal controller 323 becomes at a high level. As a result, the NMOS transistor N3 is turned on, and the node A is pulled down. Then, the corresponding boosting signals PXS0 and PXBS0 are enabled by the latch unit 327 and the boosting signal output unit 328.

If another row address is applied, the predecoding signal LAX012<0> transits to the low level and the NMOS transistor N3 is turned off. As an output signal from the pull-up controller 325 transits to a low level, the PMOS transistor P1 is turned on. As a result, the node A is pulled up, the boosting signal PXS0 is disabled, and the other boosting signal PXS1 corresponding to the predecoding signal LAX012<1> of the other row address is enabled.

If a precharge command of the corresponding bank is applied and the control signal WLSTD transits to the low level, the NMOS transistor N2 is turned off and the PMOS transistor P1 is maintained at the turn-off state regardless of the control signal WLSTD. As a result, the boosting signals PXS0 and PXBS0 are continuously maintained at the current state regardless of the precharge command.

Since the on/off operation of the PMOS transistor P1 in the normal mode is determined by the predecoding signal LAX012, the boosting signal PXS0 is disabled only when the predecoding signal LAX012 of the other row address is disabled.

As described above, in an embodiment of the present invention, the on/off operation of the PMOS transistor P1 is controlled depending on the state (or change) of the predecoding signal LAX012. For this performance, the predecoding signal LAX012 is not directly applied to the gate of the PMOS transistor P1. Instead, the logic operation result of the predecoding signal LAX012, the output signal from the repair controller 322 and the redundant control signal RWE_PX_DN is applied to the gate of the PMOS transistor P1.

When another row address is applied after the boosting signal is generated by a specific normal row address, the lower 2 bit addresses AX0 and AX1 of the new applied row address are the same with those of the previous normal row address and the address AX2 may be different from that of the previous normal row address. In this case, when the predecoding signal LAX 012 is disabled, the NMOS transistor N3 is turned off and the PMOS transistor P1 is turned on. However, while the predecoding signal LAX01 is maintained at the high level and the redundant boosting control signal RWE_PX_UP is enabled, the NMOS transistor N1 is turned on. The control signal WLSTD is enabled, and the NMOS transistor N2 is turned on. As a result, since the PMOS transistor P1 and the NMOS transistors N1 and N2 are turned on, which results in logic errors.

Accordingly, an output signal from the repair controller 322 is used as an input signal of the pull-up controller 325 lest the predecoding signal LAX012 and the output signal from the repair controller 322 should be at the low level at the same time.

In order to prevent generation of other logic errors, the redundant boosting control signal RWE_PX_DN (RWE_PX_UP in case of the boosting signal generator PX4,5,6,7) different from the redundant boosting control signal RWE_PX_UP (RWE_PX_DN in case of the boosting signal generator PX4,5,6,7) applied to the repair controller 322 is applied to the pull-up controller 325.

Hereinafter, the above logic of the pull-up controller 325 is described in more details.

To suppose that the redundant boosting control signal RWE_PX_DN is not applied to the pull-up controller 325, a corresponding terminal is fixed at a low level. If the repair address to generate the boosting signal PXS4 is applied after the boosting signal PXS0 is enabled at a specific normal row address, the boosting signal PXS0 should be disabled and the boosting signal PXS4 should be enabled. If predecoding signal LAX012 of the new applied row address is the same with that of the previous row address(address to enable the PXS0), the predecoding signal LAX012 is continuously enabled. The output signal of the pull-up controller 325 in the boosting signal generator PX0 is maintained at the high level and PMOS transistor P8 is maintained at the turn-off state. As a result, the boosting signal PXS0 is not disabled, which results in logic error where both of the boosting signals PXS0 and PXS4 are generated.

Accordingly, when a new row address is applied, although the predecoding signal LAX012 is not disabled, the redundant boosting control signal RWE_PX_DN (RWE_PX_UP in case of the boosting signal generator PX4,5,6,7) is used in the pull-up controller 325 so that an output signal from the pull-up controller 325 becomes at a low level.

For the above-described operation, the predecoding signal LAX23 is set not to be disabled in a precharge mode. If the predecoding signal LAX23 which is not disabled in the precharge mode is applied to the fuse boxes FUSE_UP or FUSE_DN, output signals of the fuse boxes may be instable.

In order to prevent the instable state, extra treatment on fuses where the predecoding signal LAX23 is applied is required in the fuse boxes FUSE_UP and FUSE_DN.

Figure 5:
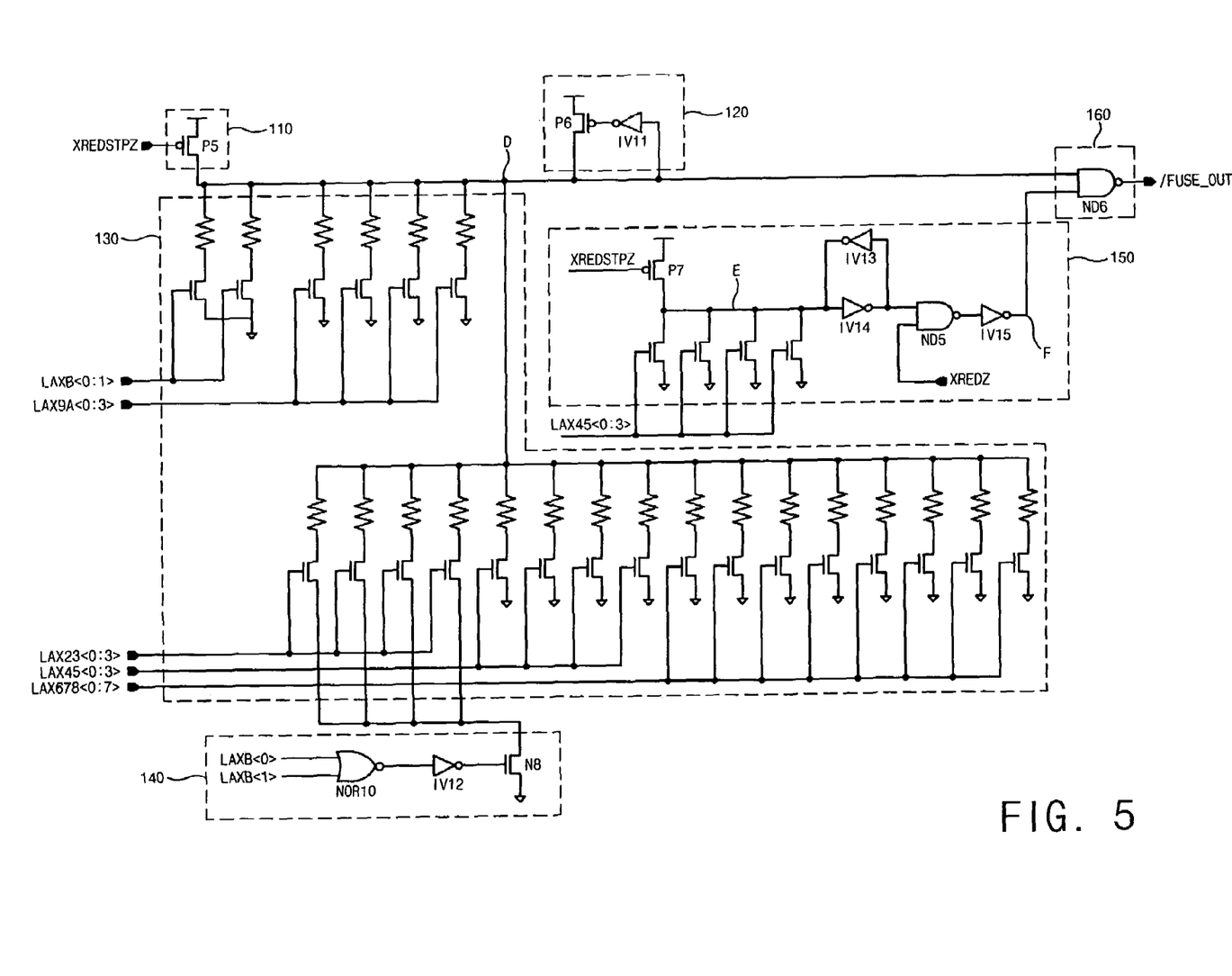
FIG. 5 is a circuit diagram of a boosting signal generator according to an embodiment of the present invention.

FIG. 5 is a circuit diagram of the fuse box according to an embodiment of the present invention.

Referring to FIG. 5, a control signal XREDSTPZ transits to a low level only in a precharge mode, and a control signal XREDZ which transits to low level only in a specific test mode is always maintained at a high level in the present invention.

Each fuse box FUSE_UP and FUSE_DN is programmed to a specific row address to be repaired. Since fuses corresponding to the specific row address are cut, each fuse box FUSE_UP and FUSE_DN outputs a high level signal only when the corresponding row address is applied.

Each fuse box FUSE_UP and FUSE_DN comprises a voltage pull-up unit 110, a voltage maintainer 120, a fuse unit 130, a fuse controller 140, an address detector 150 and a fuse signal output unit 160.

In a precharge mode, the voltage pull-up unit 110 pulls up a voltage of the node D in response to the control signal XREDSTPZ. The voltage pull-up unit 110 comprises a PMOS transistor P5 connected between the power voltage terminal and the node D. The PMOS transistor P5 has a gate to receive the control signal XREDSTPZ.

The voltage maintainer 120 maintains the voltage of the node D. The voltage maintainer 120 comprises an inverter IV11 and a PMOS transistor P6. The inverter IV11 inverts a signal of the node D. The PMOS transistor P6 is connected between the power voltage terminal and the node D and has a gate to receive the output signal from the inverter IV11.

The fuse unit 130 is programmed with a specific repair address. The fuse unit 130 pulls down the voltage of the node D when an address is applied other than the programmed repair address. The fuse unit 130 comprises a plurality of fuses connected in parallel between the node D and the ground voltage terminal and each fuse comprises a resistor and a NMOS transistor connected in series. Predecoding signals LAX23, LAX45, LAX678, LAX9A and LAXB are applied to gates of the NMOS transistors. The predecoding signals applied to the fuse boxes FUSE_UP and FUSE_DN are disabled in a precharge mode, thereby preventing leakage of current in the node D.

Since the predecoding signal LAX23 is not disabled in the precharge mode, the PMOS transistor P5 is turned on, and the voltage of the node D is dropped by the fuses corresponding to the predecoding signal LAX23. As a result, the voltage of the node D becomes instable. To prevent the instability of the node D, the fuses to receive the predecoding signal LAX23 should be controlled by the other predecoding signals disabled in the precharge mode. For this control, in the fuse unit 130, sources of the NMOS transistors to receive the predecoding signal LAX23 are not directly grounded but connected in series to the fuse controller 104.

In response to predecoding signals LAX B<0> and LAX B<1> disabled in the precharge mode, the fuse controller 140 prevents the voltage of the node D from being dropped by the predecoding signal LAX23 in the precharge mode. The fuse controller 140 comprises a NOR gate NOR10, an inverter IV12 and a NMOS transistor N8. The NOR gate NOR10 performs a NOR operation on the predecoding signals LAX B<0> and LAX B<1>. The inverter IV12 inverts an output signal from the NOR gate NOR10. The NMOS transistor N8, connected between the ground voltage terminal and the sources of the NMOS transistors which are turned on/off in response to the predecoding signal LAX23, has a gate connected to an output terminal of the NOR gate NOR12.

Although the predecoding signal LAX23 is not disabled in the precharge mode, the predecoding signal LAX B is disabled and the NMOS transistor N8 is turned off. As a result, voltage of the node D is not dropped by the corresponding fuses.

The address detector 150 detects whether the address applied to the fuse unit 130 is the programmed repair address, and outputs a fuse signal /FUSE_OUT depending on a value of the node D when programmed repair address is applied. The address detector 150 does not receive the predecoding signal LAX23 which is not disabled in the precharge mode but the predecoding signal LAX45<0:3> which is disabled in the precharge mode. If the address detector 150 receives the predecoding signal LAX23, a value of the node E becomes instable in the precharge mode and a signal of the node F also becomes instable.

The address detector 150 comprises a PMOS transistor P7, a plurality of NMOS transistors, inverters IV13, IV14 and IV15, and a NAND gate ND5. The PMOS transistor P7, connected between a power voltage terminal and the node E, has a gate to receive the control signal XREDSTPZ. The plurality of NMOS transistors, connected in parallel between the node E and the ground voltage, have gates to receive the predecoding signal LAX45. The inverters IV13 and IV14 latch the signal of the node E. The NAND gate ND5 performs a NAND operation on an output signal from the inverter IV14 and the control signal XREDZ. The inverter IV15 inverts an output signal from the NAND gate ND5.

The fuse signal output unit 160 outputs the fuse signal /FUSE_OUT in response to a voltage value of the node D and an output signal from the address detector 150. The fuse signal output unit 160 comprises a NAND gate ND6 for performing a NAND operation on the signal of the node D and the output signal from the address detector 150. In FIG. 2, the output signal from the fuse box FUSE_UP or FUSE_DN is a signal obtained by inverting the fuse signal /FUSE_OUT.

Figure 6:
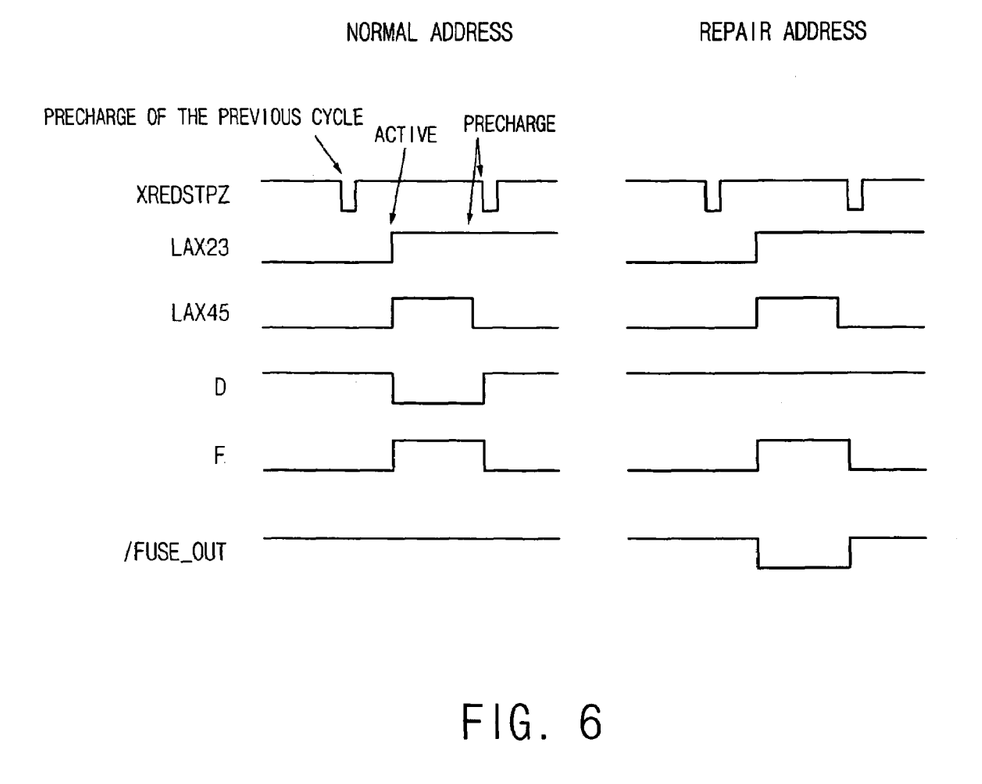
FIG. 6 is a timing diagram of the operation of the boosting signal generator of FIG. 5.

FIG. 6 is a timing diagram of the operation of the fuse box of FIG. 5. The timing diagram shows the normal operation of the fuse box although the predecoding signal LAX23 is not disabled in the precharge mode.

If an active command to a specific normal address is applied to enable the predecoding signals LAX23 and LAX45, the voltage of the node D is pulled down by the voltage drop by the fuse unit 130, and the node F transits to a high level as the node E is pulled down. Then, if a precharge command is applied, the PMOS transistor P5 is turned on. Although the predecoding signal LAX23 is not disabled in the precharge mode, the predecoding signal LAX B is disabled and the NMOS transistor N8 of the fuse controller 140 is turned off, thereby preventing the voltage drop by the fuse unit 130. As a result, the node D transits to a high level. Next, the PMOS transistor P7 is turned on in response to the control signal XREDSTPZ and the predecoding signal LAX45 is disabled to pull up the node E. the node F transits to a low level as the node E is pulled up. The fuse signal /FUSE_OUT is outputted to a high level in a normal mode although the predecoding signal LAX23 is not disabled by the precharge command.

In a repair mode, if a programmed repair address is applied and an active command is applied, the predecoding signals LAX23 and LAX45 are enabled. However, since the voltage drop by the fuse unit 130 does not occur, the node D is maintained at a pull-up state. When the predecoding signal LAX45 is enabled, the node E is pulled down and the node F transits to the high level. As a result, the fuse signal /FUSE_OUT transits to a low level and the corresponding boosting signal PXS0 is enabled. Then, if a precharge command is applied, the node D is maintained at the high level because the voltage drop does not occur due to the corresponding fuses of the fuse unit 130 by the fuse controller 140 although the predecoding signal LAX23 is not disabled. When the node E is pulled up, the node F transits to the low level and the fuse signal /FUSE_OUT transits to the high level again. In this way, the fuse signal /FUSE_OUT is outputted to the low level when the corresponding repair address is applied although the predecoding signal LAX23 is not disabled in response to the precharge command.

As discussed earlier, in a row redundancy circuit according to an embodiment of the present invention, one redundant main wordline corresponds to 8 (or more) redundant sub-wordlines to perform a redundant operation on a repair address. As a result, since the number of redundant main wordlines can be reduced by half (or less), the space of the memory device may be effectively used.

Additionally, in the row redundancy circuit according to an embodiment of the present invention, the current consumption related to generation of boosting signals can be minimized because the boosting signal is prevented from being disabled and then re-enabled in every precharge mode.

What is claimed is:

1. A row redundancy circuit comprising:
 a fuse box group array comprising a plurality of fuse box groups including at least two or more fuse boxes to detect whether repaired row addresses are applied;
 a redundant row predecoder for performing a logic operation on an output signal from the fuse box groups to selectively activated redundant main wordlines each of which corresponds to a plurality of redundant sub-wordlines; and a redundant sub-row decoder for classifying the output signals from the fuse box groups into group signals corresponding to the number of fuse boxes in each fuse box group and performing a logic operation on the group signals, to output a boosting signal for selectively activating the plurality of sub-wordlines corresponding to the each redundant main wordline, wherein the boosting signal is disabled only when a new row address is applied.

2. The row redundancy circuit according to claim 1, wherein the redundant row predecoder selectively activates the redundant main wordlines when one of fuse boxes in the fuse box group corresponding to the redundant main wordlines is enabled.

3. The row redundancy circuit according to claim 2, wherein each fuse box group corresponds to one of the redundant main wordlines, and one of the redundant main wordlines corresponds to 4×N (N: the number of fuse boxes in the fuse box group) redundant sub-wordlines.

4. The row redundancy circuit according to claim 1, wherein the redundant row predecoder activates a corresponding cell array block when the redundant main wordline is activated, and outputs a boosting control signal for controlling the boosting signal into the redundant sub-row decoder.

5. The row redundancy circuit according to claim 1, wherein the redundant sub-row decoder disables the boosting signal in response to a signal obtained by predecoding lower 3 bits of the new row address.

6. The row redundancy circuit according to claim 5, wherein the redundant sub-row decoder comprises:

a redundant boosting controller for classifying the output signals from the fuse box group array into the group signals corresponding to the number of fuse boxes in each fuse box group and performing a logic operation on the group signals, to output redundant boosting control signals; and a boosting signal generator for generating the boosting signal in response to the redundant boosting control signal and the predecoding signal of the new row address when the boosting control signal is activated.

7. The row redundancy circuit according to claim 6, wherein the boosting signal generator comprises:

a mode controller for controlling the generation of the boosting signal depending on the boosting control signal and a control signal which is enabled when a corresponding bank is activated and is disabled when the bank is precharged;

a repair controller for controlling the generation of the boosting signal in response to a predecoding signal of lower 2 bits of the row address and one of the redundant boosting control signals in a repair mode;

a normal controller for controlling the generation of the boosting signal in response to the predecoding signal of lower 3 bits of the row address in a normal mode;

a pull-up controller for performing a logic operation on a second redundant boosting control signal, an output signal from the repair controller and an output signal from the normal controller;

a pull-up unit for pulling up an output node in respond to the output signal of the pull-up controller;

a mode selector for pulling down the output node in response to an output signal from the repair controller or the normal controller depending on operation modes by the mode controller;

a latch unit for latching an signal of the output node; and a boosting signal output unit for generating a boosting signal in response to the signal of the output node and the output signal of the latch unit.

8. The row redundancy circuit according to claim 7, wherein the fuse box comprises:

a voltage pull-up unit, connected between a power voltage terminal and a first node, for pulling up a voltage of the first node in a precharge mode;

a fuse unit, programmed as a predetermined repair address, for pulling down the voltage of the first node when an address is applied other than the programmed repair address;

a fuse controller for preventing the voltage of the first node from being dropped by the fuse unit in response to a predecoding signal disabled in a precharge mode;

an address detector for detecting whether the address applied to the fuse unit is the repair address so that a fuse signal may be outputted depending on a value of the first node when the repair address is applied; and a fuse signal output unit for outputting the fuse signal depending on a value of the first node and output signals from the address detector.

* * * * *